United States Patent [19]

Moriyama

[11] Patent Number: 4,990,460

[45] Date of Patent: Feb. 5, 1991

[54] FABRICATION METHOD FOR THIN FILM FIELD EFFECT TRANSISTOR ARRAY SUITABLE FOR LIQUID CRYSTAL DISPLAY

[75] Inventor: Hiroaki Moriyama, Tokyo, Japan

[73] Assignee: NEC Corporation, Japan

[21] Appl. No.: 471,960

[22] Filed: Jan. 29, 1990

[30] Foreign Application Priority Data

Jan. 27, 1989 [JP] Japan ................................. 1-19137
Jan. 27, 1989 [JP] Japan ................................. 1-19139

[51] Int. Cl.$^5$ .............. H01L 31/0392; H01L 31/0376; H01L 21/283; H01L 21/033
[52] U.S. Cl. .................................. 437/40; 437/43; 437/101; 437/229; 357/2; 357/4; 357/23.7; 350/333
[58] Field of Search ................. 437/40, 43, 48, 50, 437/101, 228, 229; 148/DIG. 1; 357/2, 4, 23.7; 350/332, 333

[56] References Cited

U.S. PATENT DOCUMENTS

| | | | |
|---|---|---|---|
| 4,115,799 | 9/1978 | Luo | 357/4 |
| 4,413,883 | 11/1983 | Baraff et al. | 350/333 |
| 4,704,783 | 11/1987 | Possin | 437/101 |
| 4,705,358 | 11/1987 | Yamazaki et al. | 357/23.7 |
| 4,759,610 | 7/1988 | Yanagisawa | 357/23.7 |
| 4,818,981 | 4/1989 | Oki et al. | 340/784 |
| 4,820,024 | 4/1989 | Nishiura | 350/333 |
| 4,864,376 | 9/1989 | Aoki et al. | 357/4 |
| 4,894,690 | 1/1990 | Okabe | 357/4 |
| 4,918,494 | 4/1990 | Koden et al. | 357/23.7 |
| 4,928,161 | 5/1990 | Kobayashi | 357/23.7 |
| 4,933,296 | 6/1990 | Parks et al. | 357/23.7 |

FOREIGN PATENT DOCUMENTS

| | | | |
|---|---|---|---|
| 2802822 | 7/1978 | Fed. Rep. of Germany | 357/23.7 |
| 0124319 | 7/1984 | Japan | 357/23.7 |
| 0005577 | 1/1986 | Japan | 357/23.7 |
| 0073670 | 4/1987 | Japan | 437/41 |
| 0128756 | 6/1988 | Japan | 437/101 |
| 0068967 | 3/1989 | Japan | 357/23.7 |
| 0185522 | 7/1989 | Japan | 357/23.7 |

OTHER PUBLICATIONS

Snell et al., "Application of Amorphous Silicon Field Effect Transistors in Addressable Liquid Crystal Display Panels", Appl. Phys., vol. 24, 1981, pp. 357-362.

Primary Examiner—Olik Chaudhuri
Assistant Examiner—M. Wilczewski
Attorney, Agent, or Firm—Laff Whitesel Conte & Saret

[57] ABSTRACT

In a method of fabricating thin film field effect transistor array by forming gate bus lines and drain bus lines in the form of a matrix on a light transmissive insulating film, forming thin film field effect transistors in the vicinity of each crossing point of the gate bus lines and the drain bus lines, and connecting pixel electrodes to each of the thin film field effect transistors, the method of fabricating the thin film field effect transistor array in accordance with the present invention includes the step of forming a gate electrode, the pixel electrode, and the drain bus line consisting of a transparent conductive film and a first metal film, or exclusively of the transparent conductive film, on the light transmissive insulating substrate, the step of forming a laminated film consisting of a gate insulating film, an amorphous silicon layer, and an n-type amorphous silicon layer, covering at least the gate electrodes, and the step of forming the gate bus lines, source electrodes, and drain electrodes consisting of a second metal film.

16 Claims, 10 Drawing Sheets

FABRICATION METHOD FOR THIN FILM FIELD EFFECT TRANSISTOR ARRAY SUITABLE FOR LIQUID CRYSTAL DISPLAY

BACKGROUND OF THE INVENTION

1. Field of the Invention

The present invention relates to a fabrication method for a thin film field effect transistor array, and more particularly to a fabrication method for a thin film field effect transistor array suitable for active matrix liquid crystal displays.

2. Description of the Related Art

Liquid crystal displays are drawing attention as flat panel displays for portable computers and wall type televisions. In particular, the active matrix system which utilizes arrayed thin film field effect transistors formed on a glass substrate as switches for the respective pixels is expected to be applicable to televisions because of its full color display capability, and is under active development. One of the important tasks for establishing the practicability of the active matrix liquid crystal display is the cost reduction which results from the simplification of the structure and the device fabrication process. In the inversed staggered structure in which the gate electrode of the thin film field effect transistor is formed closer to the glass substrate than the source and drain electrodes, there has been disclosed a fabrication method which makes use of three sheets of photo-mask (see for example, Japanese Patent Laid Open No. 62-286271) as the prior art.

FIG. 1(a) to FIG. 1(g) show the step diagrams for forming a thin film field effect transistor element array based on the prior art method in which FIG. 1(a), FIG. 1(c), and FIG. 1(e) are plan views as seen from the top, and FIG. 1(b), FIG. 1(d), FIG. 1(f), and FIG. 1(g) are sectional views taken along the lines A—A', B—B', C—C', and D—D' in FIG. 1(a), FIG. 1(c), and FIG. 1(e). Referring to FIGS. 1(a) and 1(b), first, an indium-tin-oxide (ITO) film and a first chromium film are deposited in this order. Then, chromium gate electrodes 2a, chromium pixel electrodes 6a, transparent gate electrodes 2b, and transparent pixel electrodes 6b are formed by a photolithography method using a first photo-mask pattern. Next, referring to FIGS. 1(c) and 1(d), an $SiN_x$ film 7, an a-Si:H (hydrogenated amorphous silicon) film 8, and an $n^+$-a-Si:H film 9 are sequentially laminated, and portions of the $SiN_x$ film 7, the a-Si:H film 8, and the $n^+$-a-Si:H film 9 are removed by a photolithography method using a second photo-mask pattern except for the laminated film in the proximity of regions where thin film field effect transistors and chromium drain bus lines are to be formed. Then referring to FIGS. 1(e), 1(f), and 1(g), after forming a second chromium film, chromium drain bus lines 5a, drain electrodes 4, and source electrodes 14 are formed by a photolithography method using a third photo-mask pattern by etching the second chromium film. Then, the chromium pixel electrodes 6a consisting of the first chromium film formed on the transparent pixel electrodes 6b are removed by further etching. Simultaneously, the chromium gate electrodes 2a consisting of the first chromium film formed on the transparent gate electrodes 2b are also removed except for the portion where the chromium gate electrodes 2a cross the thin film transistors 10 and the chromium drain bus lines 5a. Next, channel parts of the thin film field effect transistors 10 are formed by removing the n-type amorphous silicon in the portions between the drain electrodes 4 and the source electrodes 14 by means of etching of the $n^+$-a-Si:H film 9 using the same resist pattern as in the above. It should be noted in this case that the gate bus line 3 has a laminated structure of the first chromium and ITO films where this gate bus line 3 cross the thin film transistor 10 and the drain bus lines 5, while it is constructed exclusively of the ITO film in other portions.

Ordinarily, five to seven sheets of photo-mask patterns are required in forming an inverted staggered-type thin film transistor array. In accordance with the aforementioned method, however, it is possible to form a thin film field effect transistor array using only three sheets of photo-mask patterns.

Nonetheless, the wiring length will have to be increased as the area of the display becomes large, and the wiring width will have to be decreased as the display becomes highly fine-sized. As a result, the wiring resistance will be increased, which will cause the voltage applied to the gate bus line and the drain bus line to generate propagation delays in conjunction with the wiring capacitance. The propagation delay causes the application of the voltage to each of the thin film transistors to be insufficient and the addressing of the signal voltage to each of the pixels to be insufficient, bringing about a deterioration in the display quality. Particularly, the gate bus line is arranged along the horizontal direction, which is larger than the vertical one so that the wiring length thereof is large and the wiring resistance becomes high. In addition, the wiring capacitances such as capacitance where the gate bus line crosses the drain bus line and channel capacitance of the thin film transistor become large, so that the influence of the propagation delay on the gate bus line is larger than on the drain bus line. In the case of the thin film field effect transistor array obtained in accordance with the prior method described above, the greater part of the gate bus line is formed of transparent conductive ITO film with resistivity which is tens to several hundred times as large as that of a metal so that the wiring resistance is higher with correspondingly higher influence on the propagation delay.

SUMMARY OF THE INVENTION

Accordingly, it is an object of the present invention to provide a method of fabricating a thin film field effect transistor element array which enable the entire formation of the gate bus line with a metal allowing a maximum of 3 photo-mask patterns to be used.

The fabrication method of a thin film field effect transistor array in accordance with the present invention includes the steps of forming on a substrate a transparent conductive film, or a transparent conductive film and a first metal film, forming on the substrate a plurality of drain bus lines, a plurality of gate electrodes, and a plurality of pixel electrodes consisting of the transparent conductive film, or the transparent conductive film and the first metal film, by selectively removing the transparent conductive film, or the transparent conductive film and the first metal film, using a first photomask, then, forming an insulating film, forming a first semiconductor thin film on the insulating film, forming an inpurity doped second semiconductor thin film on the first semiconductor thin film, forming a plurality of islands consisting of the insulating film, the first semiconductor thin film, and the second semiconductor thin film, covering at least the respective ones of the plurality of gate electrodes, by selectively removing the first semiconductor thin film, the second semiconductor thin film, and the insulating film using a second photo-mask, then, forming a second metal film, forming a plurality of gate bus lines, a plurality of source electrodes, and a plurality of drain electrodes consisting of the second metal film by selectively removing the second metal film using a third photo-mask, whereby the respective gate bus lines are connected to the respective gate electrodes, the plurality of source electrodes and the plurality of drain electrodes are formed on the second semiconductor thin film on both sides of the plurality of gate electrodes such that one group of the plurality of source electrodes and the plurality of drain electrodes are connected to the respective ones of the plurality of drain bus lines while the other group of the plurality of source electrodes and the plurality of drain electrodes are connected to the respective ones of the plurality of the pixel electrode, and then removing the second semiconductor thin films existing between the respective source electrodes and the drain electrodes.

In the inverted staggered type thin film transistor, the gate electrode is on the lower side so that the gate electrode has to be formed first. In the prior art, the gate electrode makes use of a part of the gate bus line so that not only the gate electrode but also the gate bus line are formed simultaneously at first. Consequently, the metal film of the gate bus line is also removed at the time of etching the metal film for later on forming the source and the drain electrodes.

In contrast, according to the present invention, the gate electrode and the gate bus line are separated, and the gate electrode is formed first, then the gate bus line is formed simultaneously with the source and the drain electrodes so that the gate bus line can be formed using a metal film.

BRIEF DESCRIPTION OF THE DRAWINGS

The above and further objects, features, and advantages of the present invention will become more apparent from the following detailed description taken in conjunction with the accompanying drawings, wherein.

DESCRIPTION OF THE PREFERRED EMBODIMENTS

(First Embodiment)

Figure 1A:
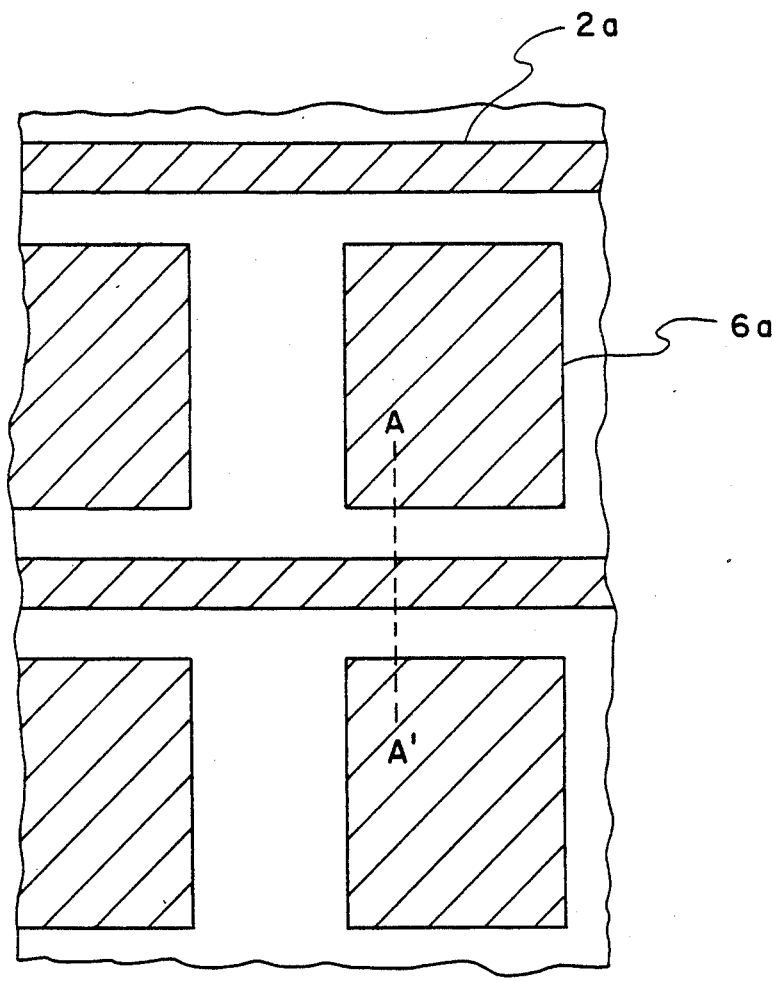
FIGS. 1(a) to 1(g) are diagrams for explaining the prior art.
Figure 1B:
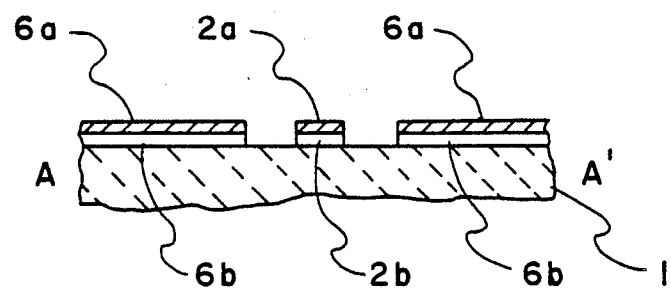
Figure 1C:
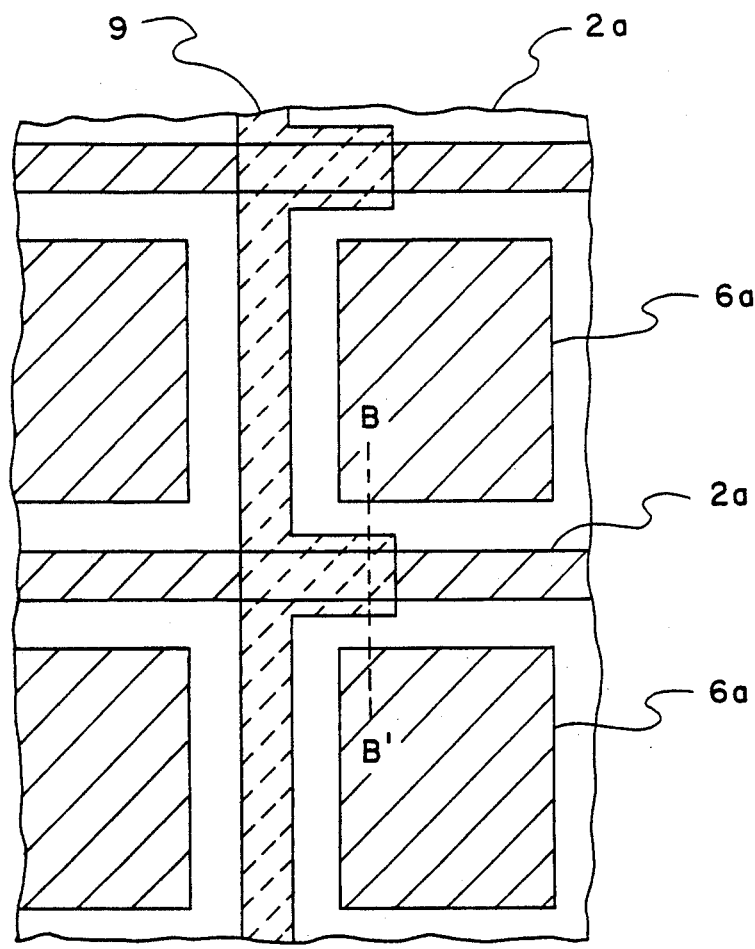
Figure 1D:
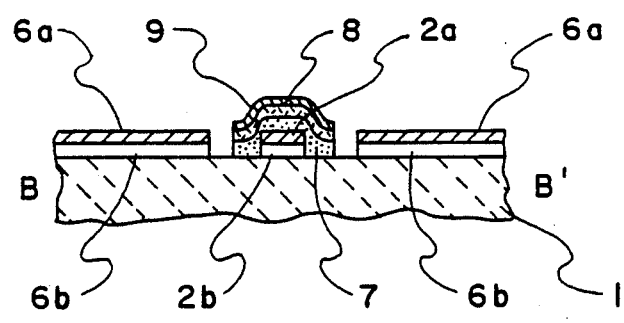
Figure 1E:
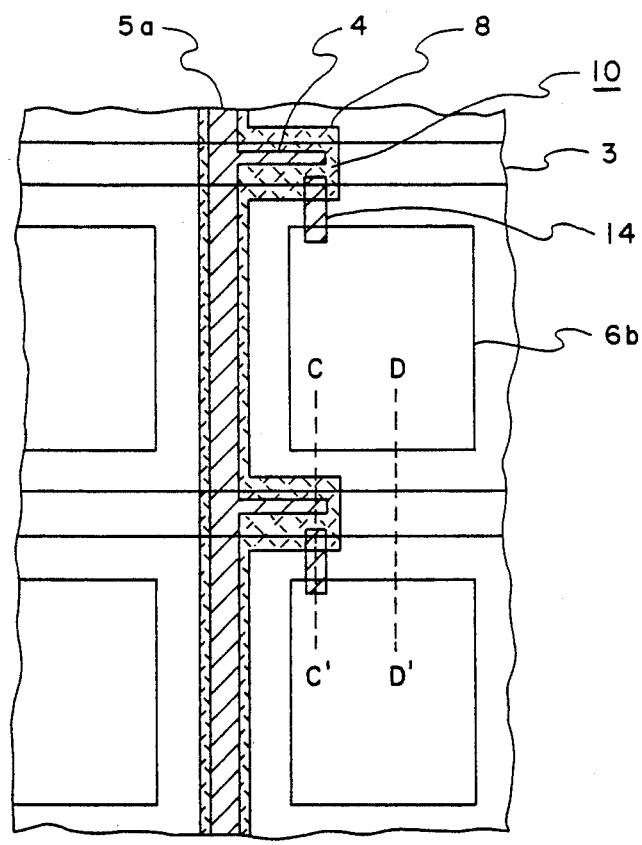
Figure 1F:
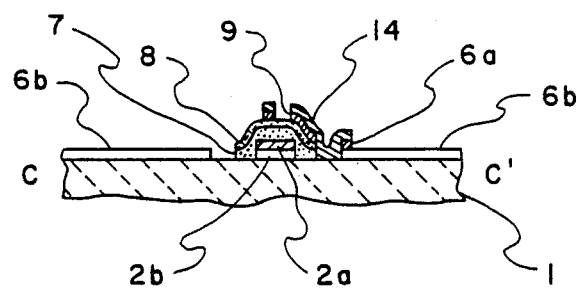
Figure 1G:
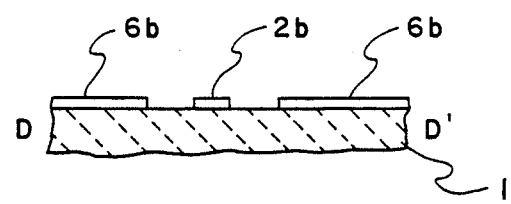
Figure 2A:
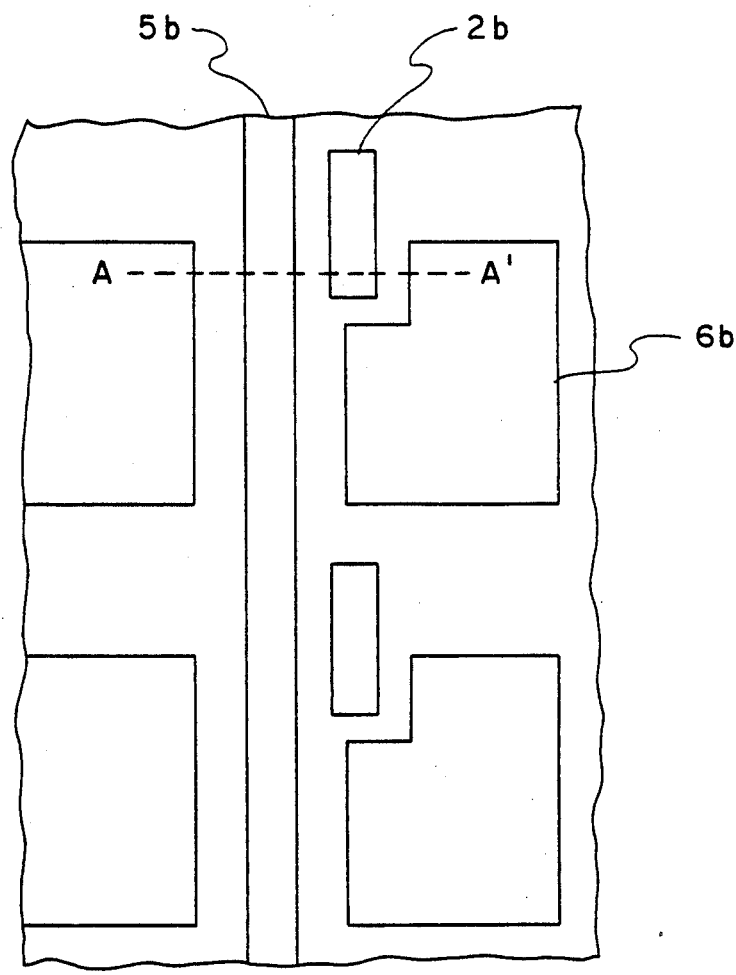
FIGS. 2(a) to 2(g) are diagrams for explaining a first embodiment of the present invention.
Figure 2B:
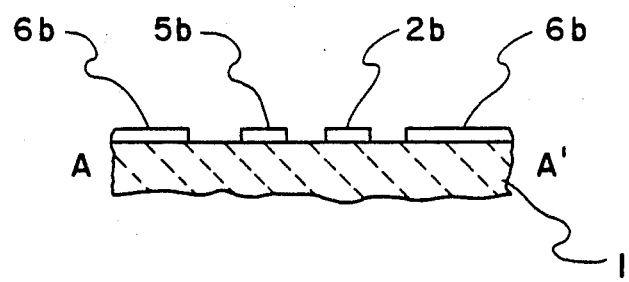
Figure 2:
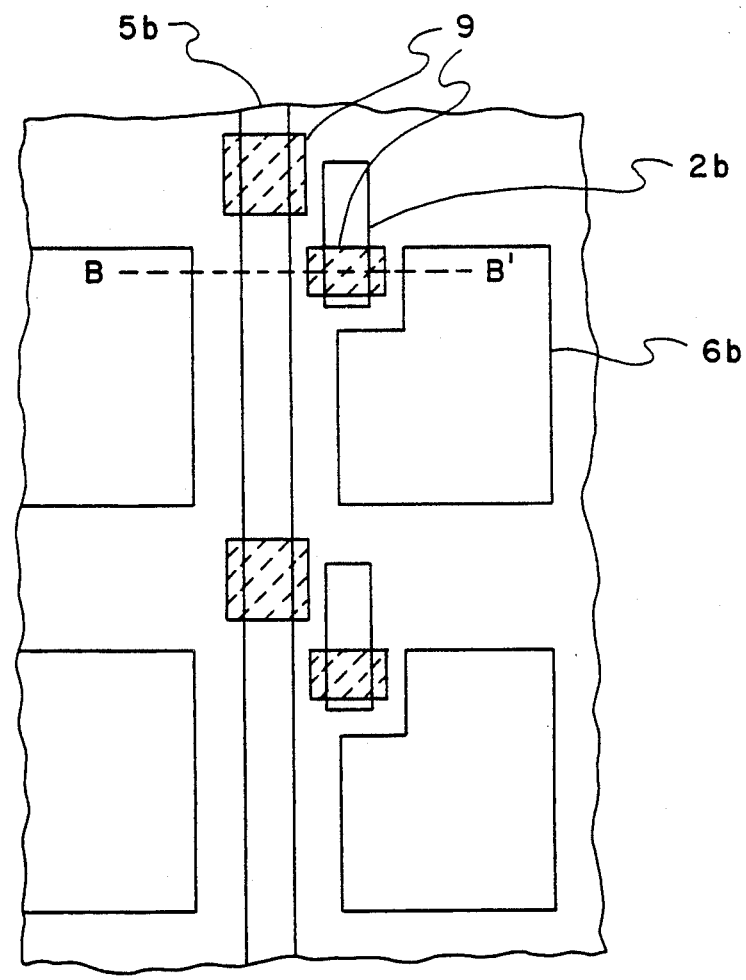
Figure 2:
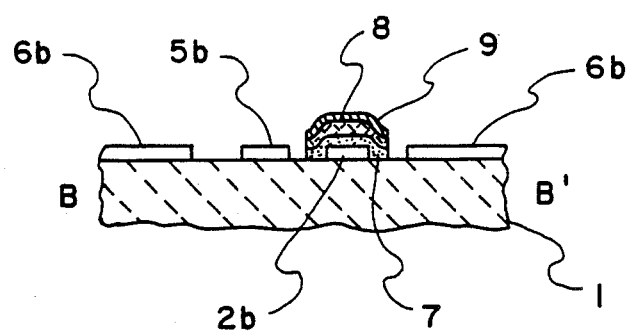
Figure 2E:
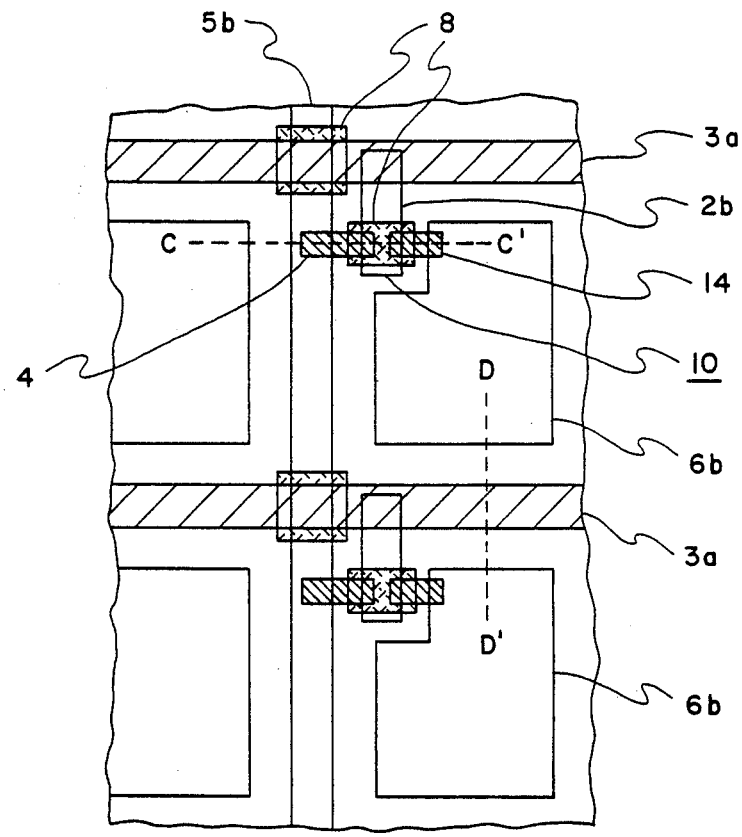

FIGS. 2(a) to 2(g) are process diagrams showing the first embodiment of the present invention wherein FIG. 2(a), FIG. 2(c), and FIG. 2(e) are plan views as seen from the top while FIG. 2(b), FIG. 2(d), FIG. 2(f), and FIG. 2(g) are sectional views taken along the lines A—A', B—B', C—C', and D—D' in FIG. 2(a), FIG. 2(c), and FIG. 2(e).

Referring to FIGS. 2(a) and 2(b), a 500 Å-thick ITO film is formed on a glass substrate 1 by sputtering, and transparent gate electrodes 2b, transparent drain bus lines 5b, and transparent pixel electrodes 6b are formed by a photolithograph process using a first photo-mask pattern. More specifically, the first photo-mask pattern is formed using a photoresist, and the portions of the ITO film that are not covered with the photoresist are removed by a wet etching method. The etching of the ITO film may also be performed by dry etching using $CCl_4$. Then, the photolithography using the first photo-mask pattern is completed by peeling the photoresist after the etching. A feature of the mask pattern is that the transparent gate electrodes 2b are given an island form and that the transparent drain bus lines 5b which are ordinarily formed simultaneously with the formation of the drain and source electrodes are now formed in advance.

Referring to FIGS. 2(c) and 2(d) next, an $SiN_x$ film 7, an a-Si:H film 8, and a phosphorus-doped $n^+$-a-Si:H film 9 are sequentially formed by a chemical vapor deposition (CVD) method and are laminated. The thicknesses of the $SiN_x$ film 7, the a-Si:H film 8, and the $n^+$-a-Si:H film 9 are set at 3000 Å, 2000 Å, and 500 Å, respectively. Then islands of the $SiN_x$ film 7, the a-Si:H film 8, and the $n^+$-a-Si:H film 9 are formed on the transparent gate electrodes 2b and at the crossing part of the chromium gate bus line 3a (see, FIG. 2(e)) and the transparent drain bus line 5b by photolithography using a second photo-mask pattern. More specifically, the shape of the second photo-mask pattern is formed using a photoresist. Then, the portions of the $SiN_x$ film 7, the a-Si:H film 8, and the $n^+$-a-Si:H film 9 that are not covered with the resist are removed, and then the photoresist is peeled.

Figure 2F:
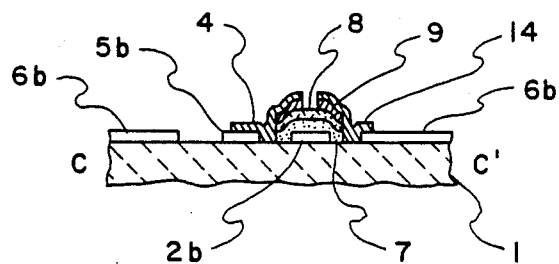
Figure 2G:
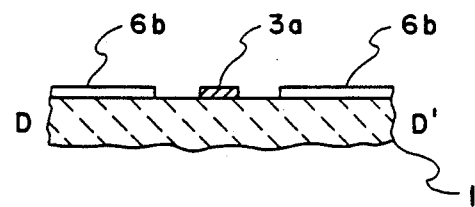

Referring to FIGS. 2(e), 2(f), and 2(g), after forming a 1000 Å-thick chromium film by sputtering, chromium gate bus lines 3a, drain electrodes 4, and source electrodes 14 are formed by photolithography using a third photo-mask pattern, and the transparent gate electrodes 2b and the transparent drain bus lines 5b are connected to the chromium gate bus lines 3a and the drain electrodes 4, respectively. Specifically, the shape of the third photo-mask pattern is formed using a photoresist, and the portion of chromium not covered with the photoresist is removed by wet etching. Then, the portions of the $n^+$-a-Si:H film between the drain electrodes 4 and the source electrodes 14 are removed by etching the $n^+$-a-Si:H film using the same resist pattern, forming the channel parts of the thin film field effect transistors 10. Finally, by removing the photoresist, the fabrication of the thin film field effect transistor element array is completed.

It should be noted that in the prior art it was necessary to go through the process of film formation six times namely, those of the ITO film, the first chromium film, the gate insulating film, the semiconductor film, the n-type semiconductor film, and the second chromium film. In contrast, in the fabrication process of the present embodiment, the number of film formation steps is reduced to five times namely, formation of the ITO film, the $SiN_x$ film, the a-Si:H film, the $n^+$-a-Si:H film, and the chromium film so that it becomes possible to shorten the fabrication process.

Furthermore, according to the present embodiment, the gate electrode is formed exclusively of the transparent conductive ITO film. Therefore, light from the bottom goes through not only the glass substrate but also the gate electrode and reaches the semiconductor film thereon to generate photo-carriers in the film, resulting in an increase in the on-current of the thin film field effect transistor.

(Second Embodiment)

Figure 3:
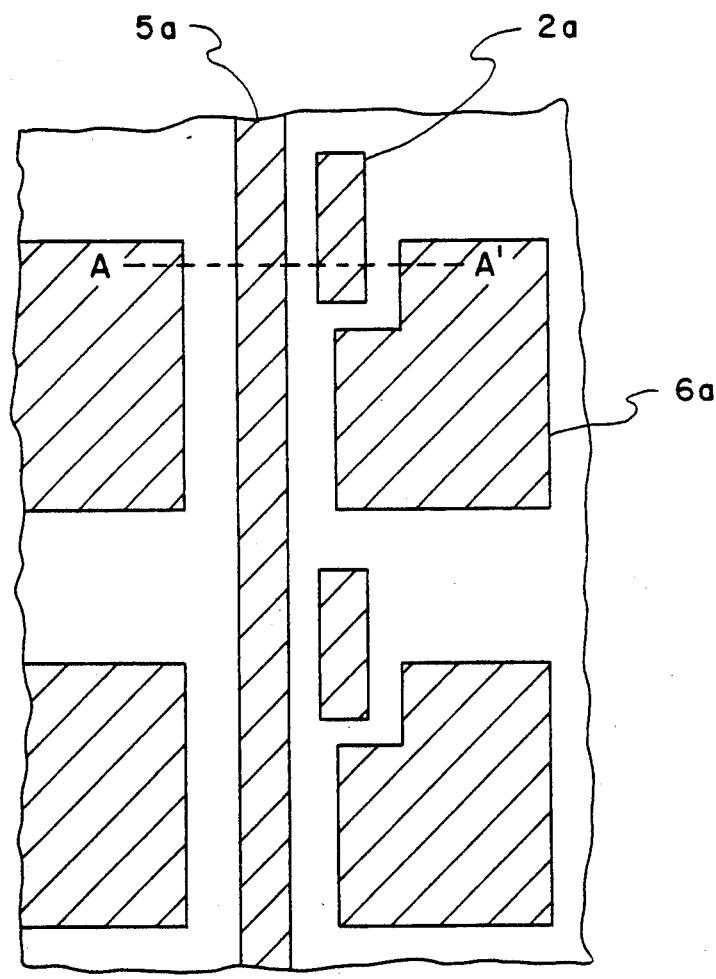
FIGS. 3(a) to 3(g) are diagrams for explaining a second embodiment of the present invention.
Figure 3:
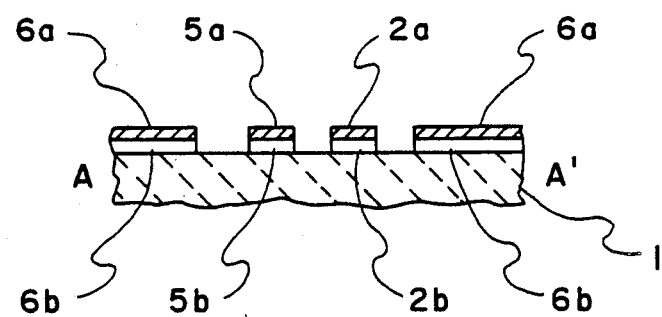
Figure 3:
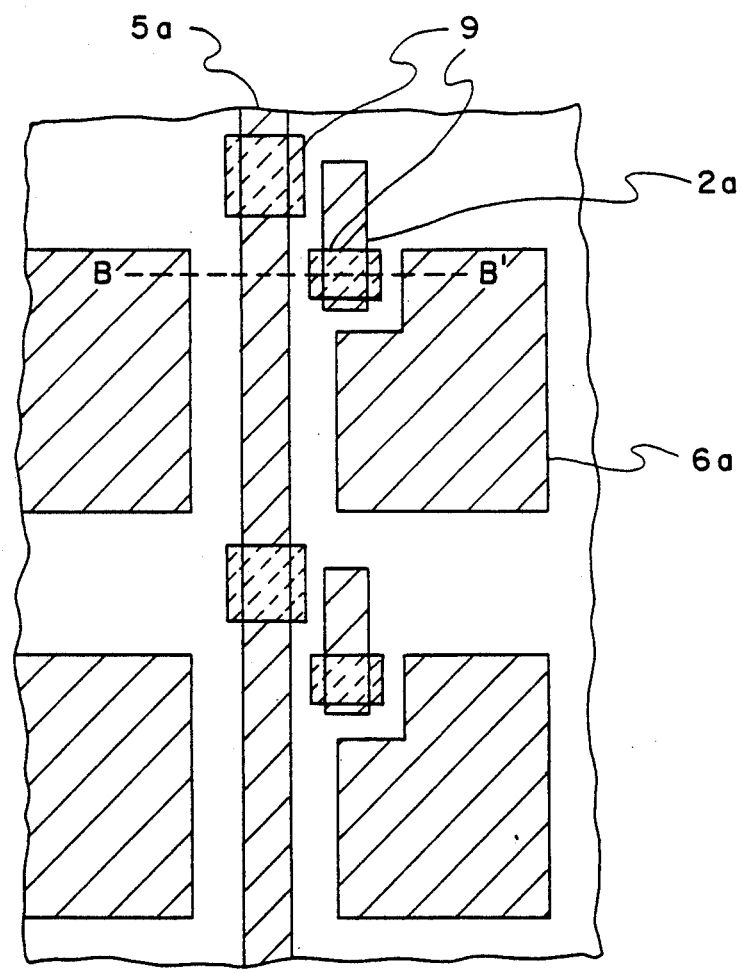
Figure 3:
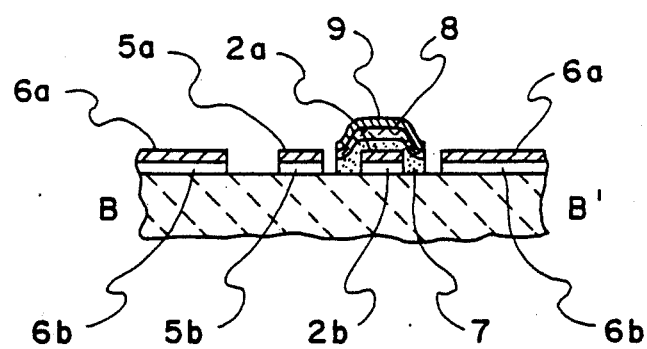
Figure 3:
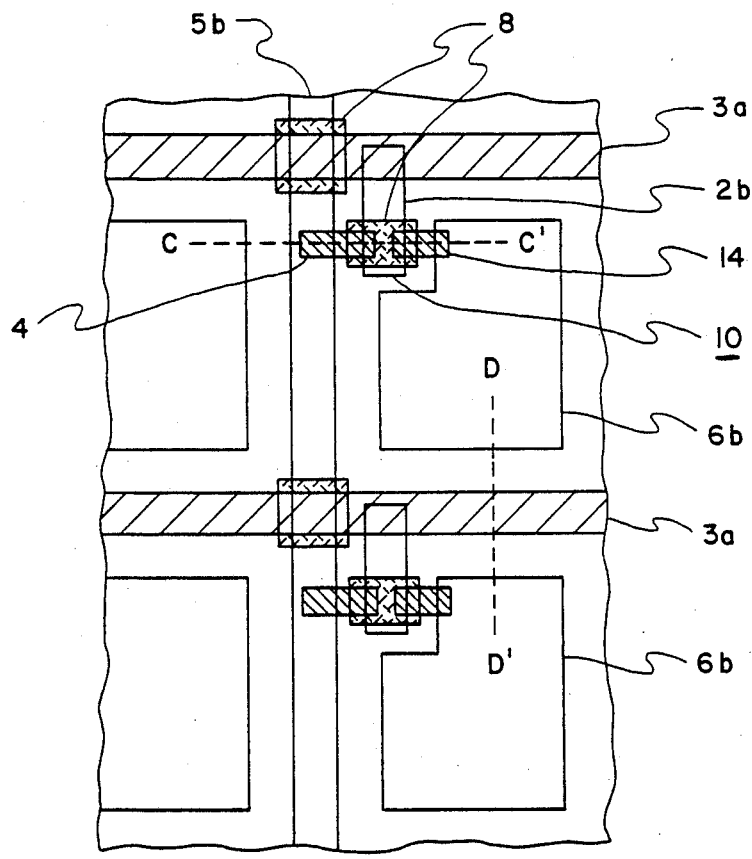
Figure 3:
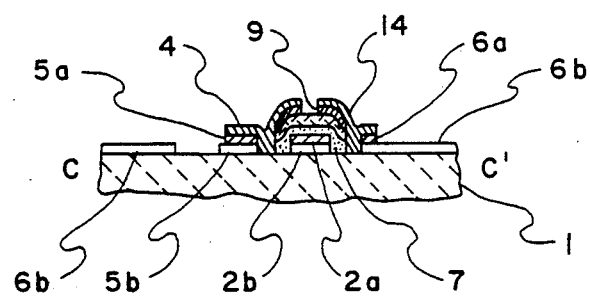
Figure 3:
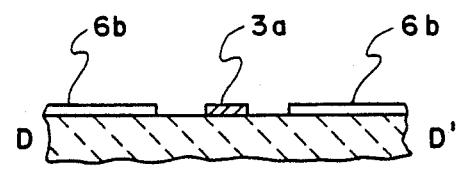

FIG. 3(a) to FIG. 3(g) are process diagrams showing a second embodiment of the present invention in which FIG. 3(a), FIG. 3(c), and FIG. 3(e) are plan views from the top, and FIG. 3(b), FIG. 3(d), FIG. 3(f), and FIG. 3(g) are sectional views taken along the line A—A', B—B', and D—D', respectively, in FIG. 3(a), FIG. 3(c), and FIG. 3(e).

Referring to FIGS. 3(a) and 3(b), first, a 500 Å-thick ITO film is formed by sputtering, then a 1000 Å-thick first chromium film is formed, and a chromium gate electrodes 2a, transparent gate electrodes 2b, chromium drain bus lines 5a, transparent drain bus lines 5b, chromium pixel electrodes 6a, and transparent pixel electrodes 6b are formed by photolithography using a first photo-mask pattern. Specifically, the first photo-mask pattern is formed using a photoresist, and the portion of the first chromium film which is not covered with the photoresist is removed by wet etching. This etching of the chromium film may be replaced by dry etching using $CCl_4$. Continuing the above, the portion of the ITO film that is not covered with the photoresist is removed by a wet etching of the ITO film using the same resist pattern. Then, by peeling the photoresist after the etching, the photolithography using the first photo-mask pattern is completed. One of the features of the photo-mask pattern is that the chromium gate electrodes 2a and the transparent gate electrodes 2b are given island form.

Referring to FIGS. 3(c) and 3(d), an $SiN_x$ film 7, an a-Si:H film 8, and an n+-a-Si:H film 9 are sequentially formed by plasma CVD, and laminated. The thickness of the $SiN_x$ film 7, the a-Si:H film 8, and the n+-a-Si:H film 9 are set at 3000 Å, 2000 Å, and 500 Å, respectively. Then, the islands consisting of the $SiN_x$ film 7, the a-Si:H film 8, and the n+-a-Si:H film 9 are formed by photolithography using a second photo-mask pattern on the chromium gate electrode 2a and on the portion where the chromium drain bus lines 5a are to cross the chromium gate bus lines 3a (see FIG. 3(e)). Specifically, the shape of the second photo-mask pattern is formed using a photoresist. Then, the portions of the $SiN_x$ 7, the a-Si:H film 8 and the n+-a-Si:H film 9 that are not covered with the photoresist are removed by dry etching using $CF_4$, and the photoresist is peeled.

Referring to FIGS. 3(e), 3(f), and 3(g), next, a 1000 Å-thick second chromium film is formed by sputtering then chromium gate bus lines 3a, drain electrodes 4, and source electrodes 14 are formed by photolithography using a third photo-mask pattern, and the chromium gate electrodes 2a and the drain electrodes 4 are connected to the chromium gate bus lines 3a and the chromium drain bus lines 5a, respectively. More specifically, the shape of the third photo-mask pattern is formed using a photoresist, and the portion of the second chromium film which is not covered with the photoresist is removed by wet etching. Then, by continuing the etching, the pixel electrodes 6a and the like made of the first chromium film are removed to expose the transparent pixel electrodes 6b and the like. Then, the channel parts of the thin film field effect transistors 10 are formed by removing the portion of the n+-a-Si:H film between the drain electrodes 4 and the source electrodes 14 by the etching of the n+-a-Si:H film 9 using the same resist pattern as in the avove. Finally, the fabrication of the thin film field effect transistor element array is completed by removing the photoresist.

In the thin film field effect transistor arrays fabricated in accordance with the first and second embodiments of the present invention the entirety of the gate bus line 3a can be formed with chromium as shown by the plan views in FIGS. 2(e) and 3(e) and the sectional views in FIGS. 2(g) and 3(g). Since the electrical resistance of chromium is in the order of 1/20 of that of ITO, it was possible to obtain a gate bus line having a wiring resistance that is minimized by about one order of magnitude compared to the prior art gate bus line with a partial ITO construction. It is to be noted that in the case of the present embodiments the drain bus line is partially made of ITO. However, the propagation delay of the signal due to the wiring resistance and the wiring capacitance is short based on the fact that the length of the drain bus line is shorter than that of the gate bus line since it is disposed in the longitudinal direction of the display, and that the drain electrode side alone of the drain bus line needs to be considered in conjunction with the capacitance of the thin film field effect transistor. Accordingly, it is possible to realize a display of large area which will not give rise to a reduction in the display quality due to insufficient addressing of the signal voltage.

It should further be noted that although the gate electrode in the first embodiment is formed exclusively of ITO, chromium film can also be used for the gate electrode as shown in the second embodiment, so that the wiring resistance of the gate electrode can further be decreased.

Moreover, in this embodiment, the chromium pixel electrodes 6a are formed on the transparent pixel electrodes 6b in advance. Therefore, the surfaces of the transparent pixel electrodes 6b are protected from hydrogen plasma during the silicon nytride deposition process and the dry etching process, resulting in no decrease in the transparency of the transparent pixel electrodes 6b.

(Third Embodiment)

Figure 4:
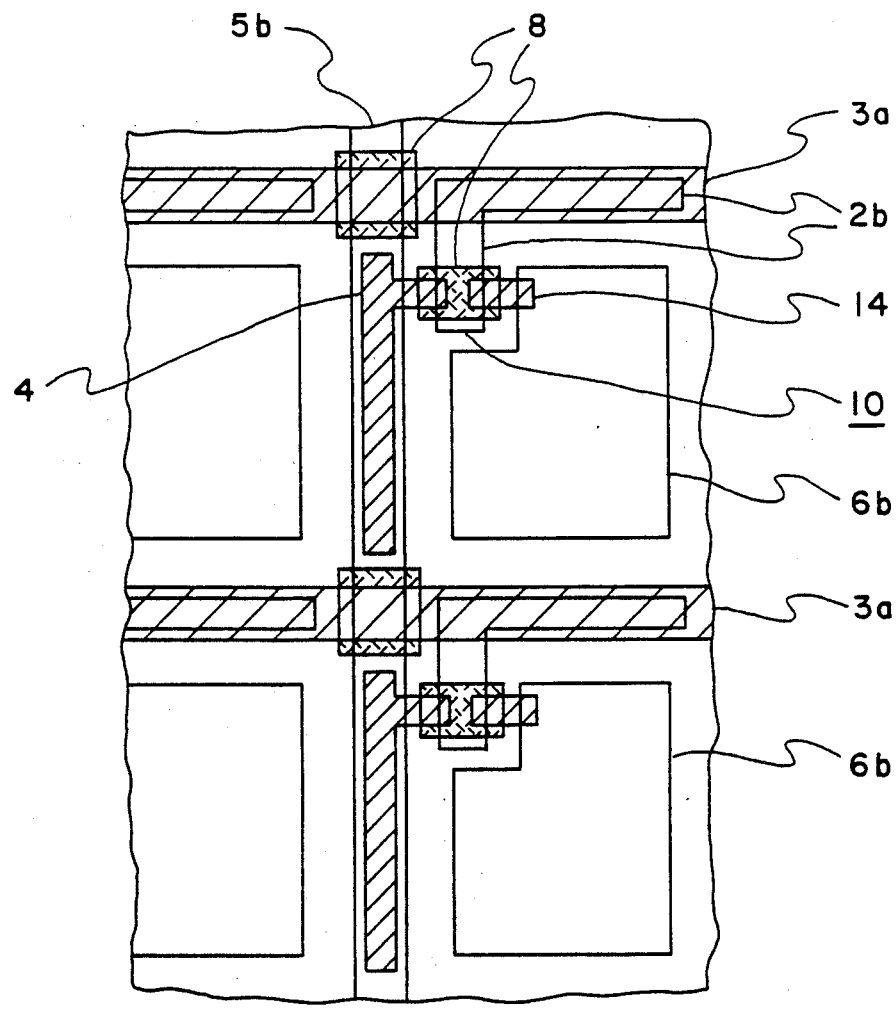
FIG. 4 is a diagram for explaining a third embodiment of the present invention.

Referring to FIG. 4, in a third embodiment of the present invention, a precautional measure against disconnection and a further reduction in the wiring resistance are realized by giving a multiple wiring to the gate bus lines by arranging both chromium gate electrodes 2a and transparent gate electrodes 2b, or transparent gate electrodes 2b alone, also on the bottom side of chromium gate bus lines 3a. Further, in the drain bus lines, nearly all portions of the drain bus lines except for the vicinity of the areas where they crosses with the gate bus lines are formed of a metal by extending the drain electrodes 4 consisting of chromium onto the transparent drain bus lines 5b, and a reduction in the resistance and the prevention of line disconnection by double wiring are realized. Except for these points, the rest is the same as in the first and the second embodiments.

It is to be noted that in the above embodiments use is made of ITO for the transparent conductive film, but $In_2O_3$ or $SnO_3$ may also be used. Further, $SiO_2$ may be used as the gate insulating film instead of $SiN_x$. Moreover, in place of chromium in the gate bus line and the drain bus line other metals such as tantalum, aluminum and molybdenum may also be utilized.

What is claimed is:

1. A method of fabricating a thin film field effect transistor array comprising the steps of:
    forming a transparent conductive film on a substrate;

forming on said substrate a plurality of drain bus lines, a plurality of gate electrodes, and a plurality of pixel electrodes consisting of said transparent conductive film by selectively removing said transparent conductive film using a first photo-mask pattern;

forming an insulating film thereafter;

forming a first semiconductor thin film on said insulating film;

forming an impurity doped second semiconductor thin film on said first semiconductor thin film;

forming a plurality of islands consisting of a laminated film of said insulating film, said first semiconductor thin film, and said second semiconductor thin film covering at least each of said plurality of gate electrodes by removing said first semiconductor thin film, said second semiconductor thin film, and said insulating film using a second photo-mask pattern;

forming a metal film thereafter;

forming a plurality of gate bus lines, a plurality of source electrodes, and a plurality of drain electrodes consisting of said metal film by selectively removing said metal film using a third photo-mask pattern, said gate bus lines being respectively connected to said gate electrodes, said plurality of source electrodes and said plurality of drain electrodes being formed on said second semiconductor thin film on both sides of said plurality of gate electrodes such that one group of said plurality of source electrodes and said plurality of drain electrodes being respectively connected to said plurality of drain bus lines while the other of said plurality of source electrodes and said plurality of drain electrodes being connected to said plurality of pixel electrodes; and removing said second semiconductor thin film existing between each pair of said source electrode and said drain electrode.

2. A method of fabricating a thin film field effect transistor array as claimed in claim 1, wherein said transparent conductive film is selected from a group consisting of an indium-tin-oxide film, an $In_2O_3$ film and an $SnO_3$ film.

3. A method of fabricating a thin film field effect transistor array as claimed in claim 2, wherein said transparent conductive film is an indium-tin-oxide film.

4. A method of fabricating a thin film field effect transistor array as claimed in claim 1, wherein said insulating film is selected from a group consisting of a silicon nitride film and a silicon oxide film.

5. A method of fabricating a thin film field effect transistor array as claimed in claim 4, wherein said insulating film is a silicon nitride film.

6. A method of fabricating a thin film field effect transistor array as claimed in claim 1, wherein said metal film is selected from a group consisting of a chromium film, a tantalum film, an aluminum film and a molybdenum film.

7. A method of fabricating a thin film field effect transistor array as claimed in claim 6, wherein said metal film is a chromium film.

8. A method of fabricating a thin film field effect transistor array as claimed in claim 1, wherein said first and second semiconductor films are hydrogenated amorphous silicon films.

9. A method of fabricating a thin film field effect transistor array comprising the steps of:

forming a transparent conductive film on a substrate;

forming a first metal film on said transparent conductive film;

forming on said substrate a plurality of drain bus lines, a plurality of gate electrodes, and a plurality of pixel electrodes consisting of a laminated film of said transparent conductive film and said first metal film by selectively removing said transparent conductive film and said first metal film using a first photo-mask pattern;

forming an insulating film thereafter;

forming a first semiconductor thin film on said insulating film;

forming an impurity doped second semiconductor thin film on said first semiconductor thin film;

forming a plurality of islands consisting of a laminated film of said insulating film, said first semiconductor thin film, and said second semiconductor thin film covering at least each of said plurality of gate electrodes by removing said first semiconductor thin film, said second semiconductor thin film, and said insulating film using a second photo-mask pattern;

forming a second metal film thereafter;

forming a plurality of gate bus lines, a plurality of source electrodes, and a plurality of drain electrodes consisting of said second metal film by selectively removing said second metal film and exposing said transparent conductive film constituting said pixel electrodes by selectively removing said first metal film using a third photo-mask pattern, said gate bus lines being respectively connected to said gate electrodes, said plurality of source electrodes and said plurality of drain electrodes being formed on said second semiconductor thin film on both sides of said plurality of gate electrodes such that one group of said plurality of source electrodes and said plurality of drain electrodes being respectively connected to said plurality of drain bus lines while the other of said plurality of source electrodes and said plurality of drain electrodes being connected to said plurality of pixel electrodes; and removing said second semiconductor thin film existing between each pair of said source electrode and said drain electrode.

10. A method of fabricating a thin film field effect transistor array as claimed in claim 9, wherein said transparent conductive film is selected from a group consisting of an indium-tin-oxide film, an $In_2O_3$ film and an $SnO_3$ film.

11. A method of fabricating a thin film field effect transistor array as claimed in claim 10, wherein said transparent conductive film is an indium-tin-oxide film.

12. A method of fabricating a thin film field effect transistor array as claimed in claim 9, wherein said insulating film is selected from a group consisting of a silicon nitride film and a silicon oxide film.

13. A method of fabricating a thin film field effect transistor array as claimed in claim 12, wherein said insulating film is a silicon nitride film.

14. A method of fabricating a thin film field effect transistor array as claimed in claim 9, wherein said first and second metal films are selected from a group consisting of a chromium film, a tantalum film, an aluminum film and a molybdenum film.

15. A method of fabricating a thin film field effect transistor array as claimed in claim 14, wherein said first and second metal films are chromium films.

16. A method of fabricating a thin film field effect transistor array as claimed in claim 9, wherein said first and second semiconductor films are hydrogenated amorphous silicon films.

* * * * *